United States Patent [19]

Webb

[11] Patent Number: 4,561,007
[45] Date of Patent: Dec. 24, 1985

[54] DOUBLE MESA AVALANCHE PHOTODETECTOR

[75] Inventor: Paul P. Webb, Beaconsfield, Canada

[73] Assignee: RCA Inc., Toronto, Canada

[21] Appl. No.: 650,636

[22] Filed: Sep. 14, 1984

[30] Foreign Application Priority Data

Apr. 10, 1984 [CA] Canada .................................. 451638

[51] Int. Cl.[4] ............................................ H01L 27/14
[52] U.S. Cl. ........................................ 357/30; 357/13; 357/16; 357/56
[58] Field of Search .................... 357/30, 13, 16, 61, 357/55, 56

[56] References Cited

U.S. PATENT DOCUMENTS

| | | | |
|---|---|---|---|
| 4,110,778 | 8/1978 | Eden et al. | 357/13 |
| 4,116,733 | 9/1978 | Olsen et al. | 148/175 |
| 4,442,444 | 4/1984 | Osaka | 357/13 |
| 4,471,370 | 9/1984 | Chen et al. | 357/30 |
| 4,473,835 | 9/1984 | Forrest et al. | 357/13 |
| 4,481,523 | 12/1984 | Osaka et al. | 357/13 |

OTHER PUBLICATIONS

Nishida et al., Applied Physics Letters 35, 251 (1979).
Olsen et al., Journal of Electronic Materials 9, 977 (1980).

Primary Examiner—William L. Sikes
Assistant Examiner—Georgia Y. Epps
Attorney, Agent, or Firm—Birgit E. Morris; Donald S. Cohen; William J. Burke

[57] ABSTRACT

The invention relates to a photodetector wherein the avalanche region is separated from the detector surfaces by a region in which the electric field under reverse bias will be less than in the avalanche region. This photodetector includes an absorptive region having a planar surface area surrounded by a non-planar surface area. A first region overlies the planar area and a second region of opposite conductivity type overlies both the first region and the non-planar area of the absorptive region. The high electric fields are restricted to the first region which is isolated from the surfaces of the photodetector.

7 Claims, 2 Drawing Figures

DOUBLE MESA AVALANCHE PHOTODETECTOR

The Governments of the United States of America and Canada have rights in this invention pursuant to Canadian Sub-Contract No. 14SU70C33-81-R-0122 under Contract No. F19628-82-C-0038 awarded by the United States Department of the Air Force.

The invention relates to an avalanche photodetector having a lower electric field at the P-N junction periphery thereby reducing the surface leakage currents and the likelihood of edge breakdown.

BACKGROUND OF THE INVENTION

Optical communication systems which operate in the wavelength range fom 1100 to 1700 nanometers (nm) are of potentially great importance because the dispersion and losses in an optical fiber are typically very low in this wavelength range. Heterojunction devices incorporating binary III–V alloys and solid solutions of these alloys have been found to be particularly useful for this application because their electronic bandgaps occur in this wavelength range and lattice-matched heterojunctions can be obtained by compositional variations. In particular, ternary and quaternary alloys of In, Ga, As and P on an InP substrate have been found to be useful materials for both light-emitters and detectors.

Problems which have affected the performance of avalanche photodetectors using these materials include bulk tunneling currents which occur at electric fields of the order of $1.5 \times 10^5$ V/cm in ternary and quaternary compounds used for the light-absorptive region, edge breakdown and multiplication of surface leakage currents at the junction periphery. The tunneling has been reduced by locating the P-N junction with its high electric field in a wide bandgap material separate from the light-absorptive region in the narrower bandgap material. This is the so-called SAM (Separated Absorbing and Multiplying) photodetector structure.

Edge breakdown and surface currents have been reduced by the use of a mesa structure in which the width of the detector decreases with increasing distance from the substrate. However, it is desirable to further reduce the electric field distribution at the junction periphery to further limit the surface field and leakage current at the junction periphery.

SUMMARY OF THE INVENTION

An avalanche photodetector includes an absorptive region having a planar surface area surrounded by a non-planar surface area. A first region overlies the planar surface area and a second region overlies the first region and the non-planar area of the absorptive region thereby providing a P-N junction between the first and second regions surrounded by a P-N junction between the absorptive and second regions. By suitable choice of dopant levels in the absorptive and first regions, the electric field at the junction periphery is maintained at a value significantly less than the field in the first region when a reverse-bias voltage is applied to the detector.

DETAILED DESCRIPTION OF PREFERRED EMBODIMENTS

Figure 1:
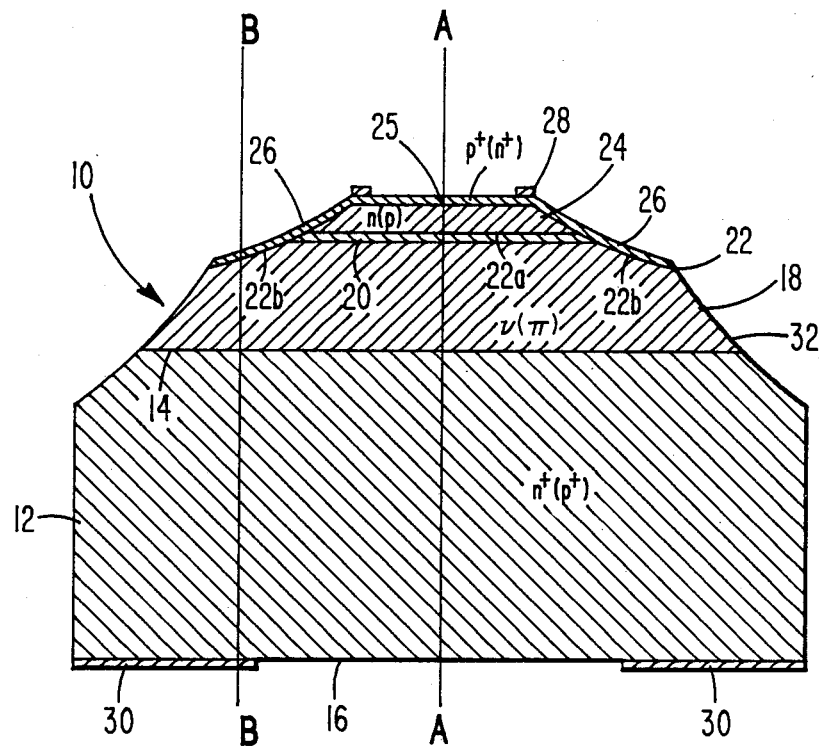
FIG. 1 is a cross-sectional view of a photodetector of the invention.

The photodetector 10, as shown in FIG. 1, includes a substrate 12 having first and second major surfaces 14 and 16, respectively, and an absorptive region 18 overlying the first major surface 14. A buffer region 20 overlies the absorptive region 18. A surface 22 comprises a planar surface area 22a of the buffer region 20 surronded by a non-planar surface area 22b of the absorptive region 18. A first region 24 overlies the planar area 22a and has a planar surface area 25. A second region 26 overlies the first region 24 and the non-planar surface area 22b. A first electrical contact 28 overlies the second region 26 and a second electrical contact 30 overlies the second major surface 16. The combination of the planar and non-planar surfaces of the second region 26 together with a curving sidewall 32 of the absorptive reigon 18 forms a double mesa structure.

The substrate 12 and the absorptive, the buffer, and first regions 18, 20 and 24 have the same conductivity type and the second region 26 has the opposite conductivity type producing a P-N junction at the interface of the second region 26 with the first region 24 and at the interface of second region 26 and the absorptive region 18 or the buffer region 20 over the non-planar area 22b.

The materials comprising all the regions are preferably chosen such that their lattice constants are matched to that of the substrate 12 to within about 0.5 percent.

The substrate 12 is composed of a semiconductor material such as N-type InP doped with sulfur to a concentration of about $5 \times 10^{18}/cm^3$, has sufficient thickness to support the structure and is typically between about 0.03 and 0.04 cm thick. The first major surface is typically treated with Caro's acid and a one percent bromine-inmethanol solution to remove surface contamination and damage prior to the formation of the different regions.

The absorptive region 18 is composed of a semiconductor material which absorbs light at the wavelength of interest in the range between 1100 and 1700 nm. Suitable materials include $In_{0.53}Ga_{0.47}As$ which absorbs at wavelengths less than 1650 nm and $In_xGa_{1-x}As_yP_{1-y}$ which absorbs light at wavelengths less than a maximum wavelength determined by the choice of x and y as disclosed, for example, by Olsen et al. in the Journal of Electronic Materials 9, 977 (1980). This region is preferably slightly $v$-type conducting, and is typically undoped material containing less than about $1 \times 10^{15}$ donors/$cm^3$. Preferably the excess conductivity modifier concentration in this region is at least a factor of about ten less than the excess conductivity modifier concentration in the first region 24. This doping level is such that for the voltages typically applied to the photodetector, the electric field is less than the threshold for tunneling. This region is between about 5 and 15 micrometers ($\mu$m) thick and preferably between about 8 and 12 $\mu$m thick.

The buffer region 20 is composed of a semiconductor material, typically $In_aGa_{1-a}As_bP_{1-b'}$ having a graded or fixed bandgap energy between that of the absorptive region 18 and the first region 24 and is typically about 0.5 $\mu$m thick. Typically the concentration of conductivity modifiers in this region is the same as that in the absorptive region 18. This region is present to avoid the slow detector response associated with the accumulation of charge carriers near the valence-band discontinuity at the heterojunction but may be omitted.

The first region 24 is composed of a semiconductor material, such a N-type InP, having a thickness and conductivity modifier concentration sufficient to produce avalanche multiplication of carriers photogenerated in the light-absorptive layer 18 when a reverse bias of sufficient magnitude is applied to the photodetector. This region preferably has an areal excess concentration of conductivity modifiers $N_1x_1$, where $N_1$ is the excess volume concentration and $x_1$ is the first region thickness, between about 2.5 and $4 \times 10^{12}/cm^2$. The thickness of this layer is between about 0.5 and 2.5 $\mu m$. The corresponding volume modifier concentration is between about 0.7 amd $7 \times 10^{16}/cm^3$ and preferably between 2 and $5 \times 10^{16}/cm^3$.

The second region 26 is composed of a highconductivity semiconductor material such as P-type InP containing an excess of $10^{18}$ Zn acceptors/$cm^3$ and has a thickness between about 1 and 2 $\mu m$.

The substrate 18 and first and second regions 24 and 26 are preferably substantially light transmissive at the wavelength to be detected.

The first electrical contact 28 is composed of a gold-/zinc alloy deposited by vacuum evaporation if the second region 26 is P-type and is typically configured so that light enters the detector through that portion of the second region 26 over the first region 24. The second electrical contact 30 is composed of a gold/tin alloy deposited by vacuum evaporation if the substrate 12 is N-type.

Figure 2:
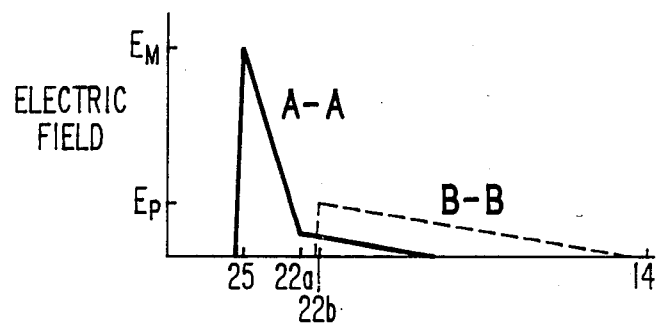
FIG. 2 is a graphical illustration of the electric fields along the lines A-A and B-B of FIG. 1.

In the operation of this photodetector a reverse-bias voltage is applied between the electrical contacts. The depletion width in the first region 24 increases with increasing voltage, reaching a value of between about 3.75 and $6 \times 10^5$ V/cm when the first region 24 is just fully depleted. A further increase in the applied voltage causes the depletion region to extend into the absorptive region 18. Assuming an abrupt P-N junction and including the buffer region 20 with the absorptive region 18, the internal electric field is:

$$E = \frac{q}{\epsilon}(N_1x_1 + N_0w)$$

where q is the electronic charge, $\epsilon$ is the dielectric constant, $N_o$ is the excess conductivity modifier concentration and w is the depletion region width in the absorptive region 18. The first term represents the field necessary to deplete the first region 24 and the second term represents the field at the surface 22a. This field distribution is illustrated as the solid curve in FIG. 2 where the abscissa labels correspond to the different surfaces of FIG. 1.

The electric field required for avalanche is dependent on the concentration of conductivity modifiers in the first region 24 and is typically in the range of 4.5 to $6 \times 10^5$ volts/cm. The electric field in the absorptive region 18 does not increase beyond about $1.0 \times 10^5$ V/cm before the electric field $E_m$ for avalanche breakdown occurs in the first region 24.

At the P-N junction between the second region 26 and the absorptive region 18, the electric field extends into the absorptive region 18 from the junction. The maximum electric field $E_p$ remains much lower than $E_m$ since the absorptive region 18 is much more lightly doped. This electric field distribution is illustrated as the broken curve in FIG. 2.

The necessity to limit the field at the periphery imposes certain restrictions on the operating voltage of the device, and therefore the impurity concentration and corresponding thickness of the first region 24. In an abrupt junction, the relationship between maximum electric field $E_p$, voltage and impurity concentration is given by:

$$E_p^2 = \frac{2qNV}{\epsilon}$$

where V is the applied reverse-bias voltage. Since $E_p$ may not exceed the $1.5 \times 10^5$ V/cm threshold for tunneling, the product (N·V) must not exceed about $7.5 \times 10^{16}$ V/$cm^3$. Thus, for example, if $N_o$ is $1 \times 10^{15}/cm^3$, then the total voltage may not be greater than about 75 volts. The voltage for avalanche is determined by integration of the electric field over the full width of the depletion region which is the area under the solid curve of FIG. 2.

The semiconductor layers which form the regions may be sequentially deposited on the substrate surface using liquid-phase or, preferably, vapor-phase epitaxy techniques such as those disclosed by Olsen et al. in U.S. Pat. No. 4,116,733, incorporated herein by reference. $\nu$-type absorptive layer and buffer layers and a first N-type InP semiconductor layer are sequentially deposited on an N-type InP substrate wafer by vapor-phase epitaxy. Portions of the surface of the first layer are covered with an etch-resistant mask and the surrounding portion of the first layer and the buffer layer and a small portion of the light-absorptive layer are removed by chemical etching in a one percent bromine-in-methanol solution. The mask is removed leaving a surface comprising planar portions of the first layer surrounded by non-planar portions which include the sides of the first layer and the surface of the absorptive layer exposed by the etching process. A P-type InP second semiconductor layer is deposited by vapor-phase epitaxy on both the planar and non-planar surfaces. The second layer and the substrate are then metallized to provide the detector contacts. The sidewalls of the individual detectors are then contoured by standard masking techniques and etching in a bromine-methanol etchant solution to form the sidewall 32. The detectors are then separated using standard techniques.

Alternatively the second region 26 may be formed by diffusion or ion implantation of an excess concentration of conductivity modifiers into the planar surface of the first layer 24 and the surrounding non-planar portions of the surfaces of the absorptive and first layers.

I claim:
1. An avalanche photodetector comprising
   a semiconductor substrate having first and second major surfaces;
   an absorptive region overlying the first major surface and having a region surface comprising a planar area and a surrounding non-planar area;
   a first region overlying said planar area;
   a second region overlying the first region and said non-planar area;
   a first electrical contact overlying said second region; and
   a second electrical contact to the substrate;
   the substrate, the absorptive region and the first region have one conductivity type and the second region has the opposite conductivity type.

2. The photodetector of claim 1 wherein the areal concentration of the conductivity modifiers in the first region is between about 2.5 and $4 \times 10^{12}/cm^2$.

3. The photodetector of claim 2 wherein the thickness of the first region is between about 0.5 and 2.5 micrometers.

4. The photodetector of claim 3 further comprising a buffer region between the absorptive and first regions.

5. The photodetector of claim 1 wherein the first region is composed of N-type InP, the second region is composed of P-type InP and the absorptive region has $\nu$-type conductivity and is composed of a material selected from a group consisting of $In_{0.57}Ga_{0.43}As$ and $In_xGa_{1-x}As_yP_{1-y}$ alloys.

6. The photodetector of claim 5 further comprising a buffer region between the absorptive and first regions.

7. The photodetector of claim 5 wherein the absorptive region has a thickness greater than 3 $\mu$m.

* * * * *